United States Patent
Yu et al.

(10) Patent No.: US 9,422,412 B2
(45) Date of Patent: *Aug. 23, 2016

(54) HALOGEN-FREE RESIN COMPOSITION AND COPPER CLAD LAMINATE AND PRINTED CIRCUIT BOARD USING SAME

(75) Inventors: Li-Chih Yu, Tao-Yuan Hsien (TW); Tse-An Lee, Tao-Yuan Hsien (TW)

(73) Assignee: ELITE MATERIAL CO., LTD., Tao-Yuan (TW)

( * ) Notice: Subject to any disclaimer, the term of this patent is extended or adjusted under 35 U.S.C. 154(b) by 493 days.

This patent is subject to a terminal disclaimer.

(21) Appl. No.: 13/240,551

(22) Filed: Sep. 22, 2011

(65) Prior Publication Data

US 2013/0075138 A1  Mar. 28, 2013

(51) Int. Cl.
| | |
|---|---|
| *C08K 3/00* | (2006.01) |
| *C08K 5/5399* | (2006.01) |
| *C08K 3/36* | (2006.01) |
| *C08K 5/09* | (2006.01) |
| *C08L 79/04* | (2006.01) |
| *H05K 1/03* | (2006.01) |
| *H05K 3/22* | (2006.01) |
| *C08L 35/06* | (2006.01) |
| *C08K 3/26* | (2006.01) |
| *C08G 73/06* | (2006.01) |
| *H05K 3/02* | (2006.01) |

(52) U.S. Cl.
CPC ............ *C08K 3/0033* (2013.01); *C08G 73/0655* (2013.01); *C08K 3/26* (2013.01); *C08K 3/36* (2013.01); *C08K 5/09* (2013.01); *C08K 5/5399* (2013.01); *C08L 35/06* (2013.01); *C08L 79/04* (2013.01); *H05K 1/0353* (2013.01); *H05K 3/022* (2013.01); *H05K 2201/012* (2013.01); *Y10T 428/31692* (2015.04)

(58) Field of Classification Search
CPC ...... C08K 3/0033; C08K 5/5399; C08K 3/26; C08K 3/36; C08K 5/09; H05K 3/022; H05K 2201/012; Y10T 428/31692; C08L 35/06; C08L 79/04; C08G 73/0655
See application file for complete search history.

(56) References Cited

U.S. PATENT DOCUMENTS

| | | | | |
|---|---|---|---|---|
| 7,115,677 B2 * | 10/2006 | Harashina et al. | ............. | 523/205 |
| 8,258,216 B2 * | 9/2012 | Qiang et al. | .................. | 524/127 |
| 8,415,414 B2 * | 4/2013 | Mader et al. | .................. | 524/101 |
| 2010/0210745 A1 * | 8/2010 | McDaniel et al. | .............. | 521/55 |
| 2010/0314160 A1 * | 12/2010 | Chang et al. | .................. | 174/255 |

* cited by examiner

*Primary Examiner* — Kevin R Kruer
(74) *Attorney, Agent, or Firm* — Enshan Hong; VLP Law Group LLP

(57) ABSTRACT

The halogen-free resin composition comprises (A) 100 parts by weight of cyanate ester resin; (B) 5 to 50 parts by weight of styrene-maleic anhydride; (C) 5 to 100 parts by weight of polyphenylene oxide resin; (D) 5 to 100 parts by weight of maleimide; (E) 10 to 150 parts by weight of phosphazene; and (F) 10 to 1000 parts by weight of inorganic filler. By using specific components at specific proportions, the halogen-free resin composition of the invention offers the features of low dielectric constant, low dissipation factor, high heat resistance and high flame retardancy, and can be made into prepreg or resin film, and thereby used in copper clad laminate or printed circuit board.

7 Claims, No Drawings

HALOGEN-FREE RESIN COMPOSITION AND COPPER CLAD LAMINATE AND PRINTED CIRCUIT BOARD USING SAME

FIELD OF THE INVENTION

The present invention relates to a halogen-free resin composition, more particularly, a halogen-free resin composition that can be used in copper clad laminate and printed circuit board.

BACKGROUND OF THE INVENTION

The electronics industry worldwide is adopting halogen-free products in line with the trends of environmental protection and green regulations. Countries and large electronics companies have set a timetable for large scale production of halogen-free electronic products. Under the Restriction of Hazardous Substances (RoHS) Directives implemented by the European Union, electronic products and components are not allowed to contain lead (Pb), cadmium (Cd), mercury (Hg), hexavalent chromium (Hex-Cr), polybrominated biphenyls (PBB), and polybrominated diphenyl ethers (PBDE). Because printed circuit board (PCB) is the foundation of electronic and electrical products, the halogen-free requirement first targets PCB products. Many international organizations have set out rigorous requirements for halogen content in PCB. The International Electrotechnical Commission (IEC) 61249-2-21 stipulates that maximum limit of chlorine and bromine in products is less than 900 ppm respectively, and the maximum limit of the overall halogen is less than 1500 ppm. The Japan Electronic Packaging and Circuits Association (JPCA) also requires the contents of chlorine and bromine to be under 900 ppm. The Green Peace Association is also pushing hard the green initiatives, demanding all manufacturers to remove poly(vinyl chloride) and brominated flame retardant completely from their electronic products to meet the definition of lead-free and halogen-free green electronics. Thus companies are now focusing on the development of halogen-free materials.

New generations of electronic products stress light, thin, short and small, and suitable for high-frequency transmission. Thus the PCB layout is gearing towards high density with more rigorous requirements for the choice of PCB material. High-frequency electronic components are connected to the PCB. To maintain the transmission speed and signal integrity, the PCB laminate material should have lower dielectric constant and lower dissipation factor. Also to make sure electronic components will function normally under high temperature and high humidity environment, the PCB must offer the features of heat resistance, flame retardancy and low moisture absorption. Having good adhesion strength, heat resistance and formability, epoxy resin has been used extensively in copper clad laminate or as sealing material in electronic and electromechanical components. From the perspective of fire safety, materials are required to possess flame retardancy. Usually non-flame retardant epoxy resin is externally added with flame retardant to achieve the flame retardant effect. For example, halogen, particularly bromine, is introduced into the epoxy resin to enhance the reactivity of epoxy group and endow it with flame retardant property. In addition, halide could decompose after long-term use under high temperature and cause the corrosion of minute wiring. The disposed electronic components will also produce halide and other hazardous compounds after burning, which is unfriendly to the environment. To replace the halogenated flame retardants, there have been studies on using phosphorus compound as flame retardant by, for example, adding phosphate ester or red phosphorus to the epoxy resin composition. However phosphate ester would undergo hydrolysis to separate acid, hence affecting the migration resistance of epoxy resin. Red phosphorus might have high flame retardancy, but it is considered a hazardous substance in fire safety law, which could produce minute amount of phosphine gas in high temperature and moist environment.

The conventional circuit board technology for making copper clad laminate uses an epoxy resin and a hardener as the raw materials of thermosetting resin composition, where, reinforcement material (e.g. fiberglass cloth) and the thermosetting resin composition are heated and adhered together to form a prepreg. The prepreg, sandwiched between two copper foil sheets, is pressed into a copper clad laminate. Prior technology commonly uses epoxy resin and hydroxy (—OH) containing phenol novolac hardener as the raw materials of thermosetting resin composition. The reaction of phenol novolac and epoxy resin would open the epoxy ring to form another hydroxyl group. Hydroxyl group would increase the dielectric constant and dielectric loss (dissipation factor) of the composition and tends to bind to water molecules to increase the hygroscopic property of the composition.

A conventional thermosetting resin composition comprising cyanate ester based resin, dicyclopentadiene based epoxy resin, fused silica, and thermoplastic resin. This thermosetting resin composition has low dielectric constant and low dissipation factor. But it uses halogen (e.g. bromine) containing flame retardant, such as tetrabromocyclohexane, hexabromocyclodecane and 2,4,6-tris(tribromophenoxy)-1,3,5-triazine in the manufacturing process. The use, recycle, or even disposal of such products that contain brominated flame retardant tend to pose a challenge to the environment. To improve the heat resistance, low dissipation factor, low hygroscopicity, high crosslinking density, high glass transition temperature, high adhesion strength, proper thermal expansion of copper clad laminate, the choice of epoxy resin, curing agent and reinforcement materials become key considerations.

In terms of electrical properties, major consideration should be given to the dielectric constant and dielectric loss (also called "dissipation factor") of the material. In general, the signal transmission speed of the laminate is inversely proportional to the square root of its dielectric constant. That is why the smaller the dielectric constant of the laminate material is better. On the other hand, lower dissipation factor means less loss in signal transmission. Thus materials with low dissipation factor provide better transmission quality.

How to develop materials with low dielectric constant and low dissipation factor and apply them to the manufacturing of high-frequency PCB is a pressing problem that PCB material suppliers need to address at the present time.

In light of the drawbacks of prior art, the inventor, based on his many years of experience in the industry, develops a halogen-free resin composition that meet the objectives of low dielectric constant, high heat resistance and high flame retardancy.

SUMMARY OF THE INVENTION

The primary object of the invention is to provide a resin composition, which, by using specific components at specific proportions, can offer the properties of low electric constant and low dissipation factor, high heat resistance and high flame retardancy, and can be made into prepreg or resin film for application in copper clad laminate and printed circuit board.

To achieve the aforesaid object, the invention provides a halogen-free resin composition comprising: (A) 100 parts by weight of cyanate ester resin; (B) 5 to 50 parts by weight of styrene-maleic anhydride; (C) 5 to 100 parts by weight of polyphenylene oxide resin; (D) 5 to 100 parts by weight of maleimide; (E) 10 to 150 parts by weight of phosphazene; and (F) 10 to 1000 parts by weight of inorganic filler.

The aforesaid composition can be used in the fabrication of prepreg, resin film, copper clad laminate, and printed circuit board. By using specific components at specific proportions, the halogen-free resin composition of the invention offers the features of low dielectric constant, low dissipation factor, high heat resistance and high flame retardancy, and can be made into prepreg or resin film, and thereby used in copper clad laminate or printed circuit board.

In the halogen-free resin composition of the invention, there is no special limitations on component (A) cyanate ester resin that any known cyanate ester resin is acceptable, such as a compound with the structure of Ar—O—C≡N, where Ar represents substituted or unsubstituted benzene, biphenyl, naphthalene, phenol novolac, bisphenol A, bisphenol A novolac, bisphenol F, bisphenol F novolac, or phenolphthalein, and could further bond with substituted or unsubstituted dicyclopentadienyl.

More specifically, the cyanate ester resin preferably comprises at least one selected from a group consisting of:

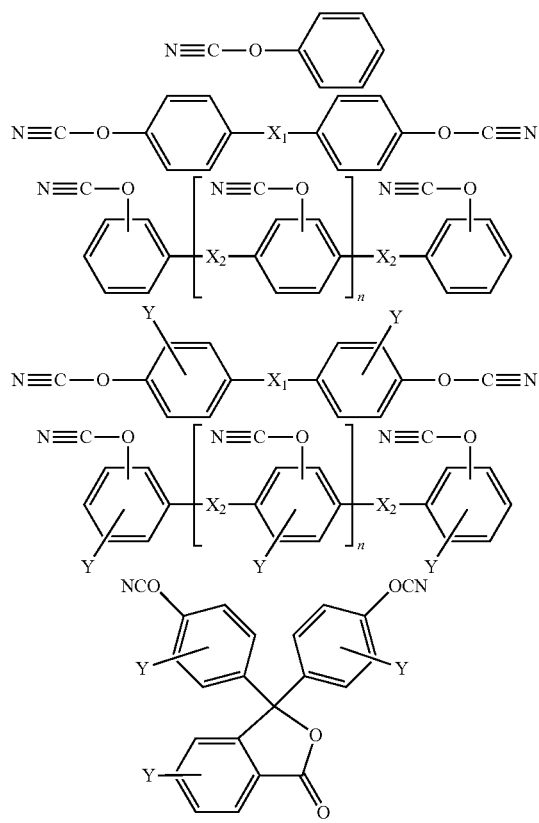

where $X_1$ and $X_2$ each independently represents at least R, Ar, $SO_2$ or O; R is selected from the group of —C(CH$_3$)$_2$—, —CH(CH$_3$)—, —CH$_2$—, and substituted or unsubstituted dicyclopentadienyl; Ar is selected from the group of substituted or unsubstituted benzene, biphenyl, naphthalene, phenol novolac, bisphenol A, ester, ring-substituted fluorenones, hydrogenated bisphenol A, bisphenol A novolac, bisphenol F and bisphenol F novolac function groups; n is an integer greater than or equal to 1; and Y represents an aliphatic functional group or an aromatic functional group. Commercial products of cyanate ester resin in the invention include: Primaset PT-15, PT-30S, PT-60S, CT-90, BADCY, BA-100-10T, BA-200, BA-230S, Methylcy, and ME-240S, which are manufactured by Lonza.

The proportions of styrene (S) to maleic anhydride (MA) in the styrene-maleic anhydride (SMA) of the invention could be 1/1, 2/1, 3/1, 4/1, 6/1 or 8/1, or combinations thereof. Commercial products for SMA copolymers include SMA-1000, SMA-2000, SMA-3000, EF-30, EF-40, EF-60 and EF-80.

On the basis of 100 parts by weight of cyanate ester resin, 5 to 50 parts by weight of styrene-maleic anhydride is added to the halogen-free resin composition of the invention, which could reduce the dielectric constant (Dk) of the halogen-free resin composition. If the content of styrene-maleic anhydride is less than 5 parts by weight, the resulting electrical property of the halogen-free resin composition will not meet the requirement; if the content of styrene-maleic anhydride is more than 50 parts by weight, the resulting prepreg will have flawed appearance and tend to have surface pitting, thereby lower yield.

The polyphenylene oxide (PPO) resin in the halogen-free resin composition of the invention comprises at least one selected from a group consisting of:

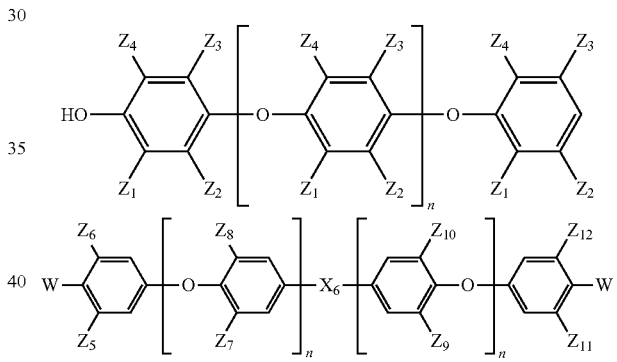

where $X_6$ is selected from the group of covalent bond, —SO$_2$—, —C(CH$_3$)$_2$—, —CH(CH$_3$)— and —CH$_2$—; $Z_1$ to $Z_{12}$ each independently represents hydrogen or a methyl group; W represents hydroxyl, ethylenyl, phenyl ethylenyl, propylenyl, butenyl, butadienyl or epoxy function group; and n is an integer greater than or equal to 1.

Because the polyphenylene oxide resin in this invention could effectively improve the dielectric property of resin composition. In addition, because of the flame retardancy of polyphenylene oxide resin, the resin composition of the invention could also meet the UL 94 V-1 fire safety requirement without the addition of a flame retardant.

The maleimide in the halogen-free resin composition of the invention comprises at least one selected from a group consisting of 4,4'-diphenylmethane bismaleimide, oligomer of phenylmethane maleimide, m-phenylenebismaleimide, bisphenol A diphenyl ether bismaleimide, 3,3'-dimethyl-5,5'-diethyl-4,4'-diphenylmethane bismaleimide, 4-methyl-1,3-phenylene bismaleimide, and 1,6-bismaleimide-(2,2,4-trimethyl)hexane.

On the basis of 100 parts by weight of cyanate ester resin, 5 to 100 parts by weight of maleimide is added to the halogen-free resin composition of the invention, which would enable the resin composition to reach the expected high heat resistance (high Tg, high glass transition temperature). If the content of maleimide is less than 5 parts by weight, the resulting halogen-free resin composition will not meet the Tg requirement. In addition, as maleimide tends to cost more, using maleimide more than 100 parts by weight could jack up the costs of the resin composition.

The phosphazene in the halogen-free resin composition of the invention is a compound containing phosphorus and nitrogen atoms and has a structural formula as shown below. Phosphazene possesses flame retardant function. When the laminate formed by the cured halogen-free resin composition burns, the phosphorus atom in the phosphazene will form coke-like phosphate coating over the laminate surface and prevent the air from entering, thereby choking off the combustion. In comparison with halogen-containing flame retardant, such as brominated flame retardant, the phosphazene used in the invention is a halogen-free compound, which will not produce hazardous substances such as dioxin during burning.

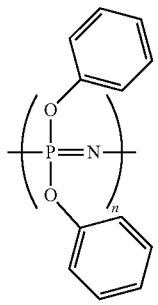

(where n is a positive integer greater than 1)

On the basis of 100 parts by weight of cyanate ester resin, 5 to 150 parts by weight of phosphazene is added to the halogen-free resin composition of the invention. If the content of phosphazene is less than 5 parts by weight, its flame retardant effect is limited; if its content is more than 150 parts by weight, it adds to the cost of the resin composition, while resulting in a laminate with unsatisfactory physical properties. The advantage of adding phosphazene in the halogen-free resin composition is to enhance the flame retardancy of the resin composition and cured products thereof. With the addition of a flame retardant compound, the halogen-free resin composition of the invention could meet the UL 94 V-0 fire safety requirement, while laminate and PCB fabricated thereof would possess good flame retardancy The main advantage of using phosphazene as flame retardant is that phosphazene does not have hydroxyl free radicals (OH). As such, the addition of phosphazene will not increase the dielectric constant of the resin composition. In addition, phosphazene has high phosphorus content (13%), high thermal decomposition temperature (Td>350° C., 5% weight loss temperature), which is higher than other phosphorus containing flame retardants, good hydrolysis resistance, low hydroscopic property and high Tg.

Conventional phosphorus-based flame retardants, such as phosphate flame retardants (OP-930, OP-935) show poor hydrolysis resistance, whereas phosphorus-containing phenol-type hardeners DOPO-HQ (or called HCA-HQ) and Fyrol PMP have polar functional group (OH) that will increase the dielectric constant of the resin composition, while lowering its thermal decomposition temperature (below 340° C.).

The invention preferably and optionally includes at least one specific flame retardant compound in addition to phosphazene to further improve the flame retardancy of the halogen-free resin composition. The optional flame retardant compound includes but is not limited to phosphate compound and nitrogen-containing phosphate compound. More specifically, the flame retardant compound preferably is at least one selected from a group consisting of but not limited to bisphenol diphenyl phosphate, ammonium polyphosphate, hydroquinone bis-(diphenyl phosphate), bisphenol A bis-(diphenylphosphate), tri(2-carboxyethyl)phosphine (TCEP), tri (isopropylchloro)phosphate, trimethyl phosphate (TMP), dimethyl methyl phosphonate (DMMP), resorcinol dixylenylphosphate (RDXP) (ex. PX-200), melamine polyphosphate, phosphazo compound, 9,10-dihydro-9-oxa-10-phosphaphenanthrene-10-oxide (DOPO) and derivatives or resins thereof, melamine cyanurate, and tri-hydroxy ethyl isocyanurate. For example, the flame retardant compound could be a DOPO compound, DOPO resin (e.g. DOPO-HQ, DOPO-PN, DOPO-BPN), or DOPO-based epoxy resin, in which DOPO-BPN could be DOPO-BPAN, DOPO-BPFN, DOPO-BPSN, or other bisphenol novolac compounds.

The main purpose of adding inorganic filler to the halogen-free resin composition is to increase its thermal conductivity, improve its thermal expansion and mechanical strength. The inorganic filler preferably is uniformly distributed in the halogen-free resin composition.

The inorganic filler includes silica (fused, non-fused, porous, or hollow), aluminum oxide, aluminum hydroxide, magnesium oxide, magnesium hydroxide, calcium carbonate, aluminum nitride, boron nitride, aluminum silicon carbide, silicon carbide, sodium carbonate, titanium dioxide, zinc oxide, zirconium oxide, quartz, diamond powder, diamond-like powder, graphite, magnesium carbonate, potassium titanate, ceramic fiber, mica, boehmite (AlOOH), zinc molybdate, ammonium molybdate, zinc borate, calcium phosphate, calcined talc, talc, silicon nitride, mullite, calcined kaolin, clay, basic magnesium sulfate whisker, mullite whisker, barium sulfate, magnesium hydroxide whisker, magnesium oxide whisker, calcium oxide whisker, nano carbon tube, nano silica and inorganic powder thereof, and powder particles modified by organic core-shell as insulator. The inorganic filler could come in spherical, fiber, plate, particle, sheet or whisker shape, and could optionally be pretreated by silane coupling agent.

The inorganic filler could be granular powder under 100 μm in size, preferably 1~20 μm in size, and most preferably nanogranular powder under 1 μm in size. Whisker inorganic filler could be powder under 50 μm in diameter and 1-200 μm in length.

On the basis of 100 parts by weight of cyanate ester resin, 10 to 1000 parts by weight of inorganic filler is added to the halogen-free resin composition of the invention. If the content of inorganic filler is less than 10 parts by weight, the effects of improved thermal conductivity, thermal expansion and mechanical strength in resin composition will not be obvious; if its content is more than 1000 parts by weight, the fluidity of halogen-free resin composition will be adversely affected, so will its bonding with copper foil.

In consideration of better electrical properties, the resin composition of the invention preferably uses fused silica, porous silica, hollow silica, spherical silica or any combination thereof for filler.

The halogen-free resin composition of the invention could further include at least one compound or modifications thereof selected from a group consisting of epoxy resin, phenol resin, phenol novolac resin, amino resin, phenoxy resin, benzoxazine resin, styrene resin, polybutadiene resin, polyamide resin, polyimide resin, and polyester resin.

The halogen-free resin composition of the invention could further include epoxy resin selected from a group consisting of bisphenol A epoxy resin, bisphenol F epoxy resin, bisphenol S epoxy resin, bisphenol AD epoxy resin, phenol novolac epoxy resin, bisphenol A novolac epoxy resin, o-cresol novolac epoxy resin, trifunctional epoxy resin, tetrafunctional epoxy resin, multifunctional epoxy resin, dicyclopentadiene (DCPD) epoxy resin, phosphorus-containing epoxy resin, DOPO-containing epoxy resin, DOPO-HQ containing epoxy resin, p-xylene epoxy resin, naphthalene-based epoxy resin, benzopyran-based epoxy resin, biphenyl novolac epoxy resin, phenol aralkyl novolac epoxy resin, and combinations thereof.

The halogen-free resin composition of the invention preferably includes DCPD epoxy resin or naphthalene-based epoxy resin. Adding DCPD epoxy resin could reduce the hygroscopicity of the resin composition, while adding naphthalene based epoxy resin could increase the rigidity and heat resistance of the resin composition.

The halogen-free resin composition of the invention optionally includes surfactant, silane coupling agent, curing accelerator, toughening agent or solvent additive. The main purpose of adding surfactant is to improve the even distribution and prevent the aggregation of inorganic fillers in the resin composition. The main purpose of adding toughening agent is to improve the flexibility of the resin composition. The main purpose of adding curing accelerator is to increase the reaction rate of the resin composition. The main purpose of adding solvent is to change the solid content of the resin composition and modify its viscosity.

The aforesaid silane coupling agent is silane or siloxane, or by the type of functional group, could be amino silane, amino siloxane, epoxy silane, or epoxy siloxane.

The aforesaid curing accelerator is a catalyst such as Lewis base or Lewis acid, wherein Lewis base includes one or the combination of imidazole, boron trifluoride-amine complex, ethyltriphenyl phosphonium chloride, 2-methylimidazole (2MI), 2-phenyl-1H-imidazole (2PZ), 2-ethyl-4-methylimidazole (2E4MZ), triphenylphosphine (TPP), and 4-dimethylaminopyridine (DMAP), and Lewis acid include metal salt compound, such as the metal salt compound of manganese, iron, cobalt, nickel, copper and zinc, such as zinc isooctanoate and cobalt isooctanoate.

The aforesaid toughening agent could be rubber resin, carboxyl-terminated butadiene acrylonitrile rubber (CTBN) or core-shell polymer.

The aforesaid solvent includes methanol, ethanol, ethylene glycol mono methylether, acetone, methyl ethyl ketone (MEK), methyl isobutyl ketone, cyclohexanone, toluene, dimethylbenzene, methoxyethyl acetate, ethoxyethyl acetate, propoxyethyl acetate, ethyl acetate, dimethyl formamide, propylene glycol methyl ether, or mixtures thereof.

To achieve low dielectric constant and low dissipation factor, the resin composition of the invention must decrease the residual hydroxyl group concentration as much as possible, that is, increase the crosslinking densities between resins. Adding the components of the resin composition at the proportions disclosed could bring about optimal crosslinking between the components and result in minimum residual resins with unreacted functional groups.

Another object of the invention is to disclose a resin film having the properties of low dielectric constant, flame retardancy, low hygroscopicity, and halogen-free that can be used as insulating material for laminate and PCB.

The resin film of the invention comprises the aforementioned halogen-free resin composition, wherein the halogen-free resin composition is heated to become semi-cured. For example, the halogen-free resin composition is laid on polyethylenyl terephthalate (PET) film and heated to form resin film.

Yet another object of the invention is to disclose a resin-coated copper foil (RCC), comprising at least a copper foil and at least an insulating layer, wherein the copper foil could further contain the alloy of copper and aluminum, nickel, platinum, silver, or gold. By laminating the resin film disclosed in the invention to at least one sheet of metal foil and then removing the aforesaid PET film and heat curing the resin film and the copper foil under high temperature and high pressure, an insulating layer that adheres closely to the copper foil is formed.

A further object of the invention is to disclose a prepreg having the properties of high mechanical strength, low dielectric constant and low dissipation factor, flame retardancy, low hygroscopicity, and halogen-free. The prepreg of the invention comprises a reinforcement material and the aforementioned halogen-free resin composition, wherein the reinforcement material is impregnated with the halogen-free resin composition, which becomes semi-cured under high temperature heating. The reinforcement material can be fiber material, woven fabric and non-woven fabric, such as fiberglass cloth, which can increase the mechanical strength of the prepreg. In addition, the reinforcement material can be optionally pre-treated by silane coupling agent or siloxane coupling agent, such as fiberglass cloth pretreated by silane coupling agent.

The aforementioned prepreg can be cured to form a cured sheet or cured insulating layer under high temperature heating or under high temperature and high pressure condition. If the halogen-free resin composition contains solvent, the solvent will evaporate in the process of high-temperature heating.

Yet another object of the invention is to disclose a copper clad laminate having the properties of low dielectric constant, flame retardancy, low hygroscopicity, high mechanical strength, and halogen-free, and is particularly suitable for use in PCB capable of high-speed, high-frequency signal transmission. As such, the invention provides a copper clad laminate, comprising two or more copper foil sheets and at least an insulating layer, wherein the copper foil could further contain the alloy of copper and aluminum, nickel, platinum, silver, or gold; the insulating layer is formed by curing the aforementioned prepreg under high temperature and high pressure, or laminating the aforementioned prepreg between two sheets of copper foil and then pressing under high temperature and high pressure.

The copper clad laminate described above offers at least one of the following advantages: low dielectric constant and low dissipation factor, good heat resistance and flame redundancy, low hygroscopicity, higher thermal conduction, lower thermal expandability, better mechanical strength, and environmentally friendly without containing halogen. The copper clad laminate may be further formed into a printed circuit board (PCB) after the circuit fabrication process, and such PCB after connecting electronic components may be operated under challenging environment of high temperature and high humidity without having its quality affected.

Yet another object of the invention is to disclose a printed circuit board having the properties of low dielectric constant, flame retardancy, low hygroscopicity, high mechanical strength, and halogen-free and is particularly suitable for use in high-speed, high-frequency signal transmission. Wherein the printed circuit board comprises at least a copper clad laminate described above and is fabricated using standard printed circuit board fabrication process.

To further disclose the invention for implementation by people with common knowledge in the field, a few examples are cited below. However it should be noted that the examples below are meant to further explain the invention and should not be construed as a limitation on the actual applicable scope of the invention, and as such, all modifications and alterations without departing from the spirits of the invention shall remain within the protected scope and claims of the invention.

The objects, features and effects of the invention are described in detail below with embodiments in reference to the accompanying diagrams.

DETAILED DESCRIPTION OF THE PREFERRED EMBODIMENTS

The components of resin composition in Examples 1-5 are depicted in Table 1, while those of resin composition in Comparative Examples 1-8 are depicted in Table 3.

Example 1 (E1)

A resin composition comprising:
(A) 100 parts by weight of cyanate ester resin (BA-230S);
(B) 50 parts by weight of styrene-maleic anhydride (EF-40);
(C) 100 parts by weight of polyphenylene oxide resin (MX-90);
(D) 100 parts by weight of maleimide (BMI-2300);
(E) 65 parts by weight of phosphazene (SPB-100);
(F) 125 parts by weight of fused silica (filler);
(G) 200 parts by weight of methyl ethyl ketone (MEK, solvent); and
(H) 0.01 parts by weight of zinc octanoate (catalyst).

Example 2 (E2)

A resin composition comprising:
(A) 100 parts by weight of cyanate ester resin (BA-230S);
(B) 5 parts by weight of styrene-maleic anhydride (EF-40);
(C) 100 parts by weight of polyphenylene oxide resin (MX-90);
(D) 100 parts by weight of maleimide (BMI-2300);
(E) 55 parts by weight of phosphazene (SPB-100);
(F) 110 parts by weight of fused silica (filler);
(G) 170 parts by weight of methyl ethyl ketone (MEK, solvent); and
(H) 0.01 parts by weight of zinc octanoate (catalyst).

Example 3 (E3)

A resin composition comprising:
(A) 100 parts by weight of cyanate ester resin (BA-230S);
(B) 50 parts by weight of styrene-maleic anhydride (EF-40);
(C) 5 parts by weight of polyphenylene oxide resin (MX-90);
(D) 100 parts by weight of maleimide (BMI-2300);
(E) 45 parts by weight of phosphazene (SPB-100);
(F) 90 parts by weight of fused silica (filler);
(G) 130 parts by weight of methyl ethyl ketone (MEK, solvent); and
(H) 0.01 parts by weight of zinc octanoate (catalyst).

Example 4 (E4)

A resin composition comprising:
(A) 100 parts by weight of cyanate ester resin (BA-230S);
(B) 50 parts by weight of styrene-maleic anhydride (EF-40);
(C) 100 parts by weight of polyphenylene oxide resin (MX-90);
(D) 5 parts by weight of maleimide (BMI-2300);
(E) 45 parts by weight of phosphazene (SPB-100);
(F) 90 parts by weight of fused silica (filler);
(G) 130 parts by weight of methyl ethyl ketone (MEK, solvent); and
(H) 0.01 parts by weight of zinc octanoate (catalyst).

Example 5 (E5)

A resin composition comprising:
(A) 50 parts by weight of cyanate ester resin (BA-230S);
(B) 50 parts by weight of cyanate ester resin (PT-30S);
(C) 25 parts by weight of styrene-maleic anhydride (EF-30);
(D) 25 parts by weight of styrene-maleic anhydride (EF-40);
(E) 50 parts by weight of polyphenylene oxide resin (MX-90);
(F) 25 parts by weight of maleimide (BMI-2300);
(G) 25 parts by weight of maleimide (Homide 121);
(H) 50 parts by weight of phosphazene (SPB-100);
(I) 15 parts by weight of DCPD-epoxy resin;
(J) 15 parts by weight of naphthalene based epoxy resin;
(K) 50 parts by weight of fused silica (filler);
(L) 50 parts by weight of spherical silica (filler);
(M) 140 parts by weight of methyl ethyl ketone (MEK, solvent);
(N) 0.02 parts by weight of zinc octanoate (catalyst); and
(O) 0.2 parts by weight of 2E4MI (catalyst).

Comparative Example 1 (C1)

A resin composition comprising:
(A) 100 parts by weight of cyanate ester resin (BA-230S);
(B) 3 parts by weight of styrene-maleic anhydride (EF-40);
(C) 100 parts by weight of polyphenylene oxide resin (MX-90);
(D) 100 parts by weight of maleimide (BMI-2300);
(E) 55 parts by weight of OP-935 (flame retardant);
(F) 110 parts by weight of fused silica (filler);
(G) 170 parts by weight of methyl ethyl ketone (MEK, solvent); and
(H) 0.01 parts by weight of zinc octanoate (catalyst).

Comparative Example 2 (C2)

A resin composition comprising:
(A) 100 parts by weight of cyanate ester resin (BA-230S);
(B) 60 parts by weight of styrene-maleic anhydride (EF-40);
(C) 100 parts by weight of polyphenylene oxide resin (MX-90);
(D) 100 parts by weight of maleimide (BMI-2300);
(E) 65 parts by weight of OP-935 (flame retardant);
(F) 130 parts by weight of fused silica (filler);
(G) 200 parts by weight of methyl ethyl ketone (MEK, solvent); and
(H) 0.01 parts by weight of zinc octanoate (catalyst).

Comparative Example 3 (C3)

A resin composition comprising:
(A) 100 parts by weight of cyanate ester resin (BA-230S);
(B) 50 parts by weight of styrene-maleic anhydride (EF-40);

(C) 3 parts by weight of polyphenylene oxide resin (MX-90);
(D) 100 parts by weight of maleimide (BMI-2300);
(E) 45 parts by weight of OP-935 (flame retardant);
(F) 90 parts by weight of fused silica (filler);
(G) 130 parts by weight of methyl ethyl ketone (MEK, solvent); and
(H) 0.01 parts by weight of zinc octanoate (catalyst).

Comparative Example 4 (C4)

A resin composition comprising:
(A) 100 parts by weight of cyanate ester resin (BA-230S);
(B) 50 parts by weight of styrene-maleic anhydride (EF-40);
(C) 110 parts by weight of polyphenylene oxide resin (MX-90);
(D) 100 parts by weight of maleimide (BMI-2300);
(E) 65 parts by weight of OP-935 (flame retardant);
(F) 130 parts by weight of fused silica (filler);
(G) 200 parts by weight of methyl ethyl ketone (MEK, solvent); and
(H) 0.01 parts by weight of zinc octanoate (catalyst).

Comparative Example 5 (C5)

A resin composition comprising:
(A) 100 parts by weight of cyanate ester resin (BA-230S);
(B) 50 parts by weight of styrene-maleic anhydride (EF-40);
(C) 100 parts by weight of polyphenylene oxide resin (MX-90);
(D) 3 parts by weight of maleimide (BMI-2300);
(E) 45 parts by weight of OP-935 (flame retardant);
(F) 90 parts by weight of fused silica (filler);
(G) 130 parts by weight of methyl ethyl ketone (MEK, solvent); and
(H) 0.01 parts by weight of zinc octanoate (catalyst).

Comparative Example 6 (C6)

A resin composition comprising:
(A) 100 parts by weight of cyanate ester resin (BA-230S);
(B) 50 parts by weight of styrene-maleic anhydride (EF-40);
(C) 100 parts by weight of polyphenylene oxide resin (MX-90);
(D) 120 parts by weight of maleimide (BMI-2300);
(E) 65 parts by weight of OP-935 (flame retardant);
(F) 130 parts by weight of fused silica (filler);
(G) 210 parts by weight of methyl ethyl ketone (MEK, solvent); and
(H) 0.01 parts by weight of zinc octanoate (catalyst).

Comparative Example 7 (C7)

A resin composition comprising:
(A) 100 parts by weight of cyanate ester resin (BA-230S);
(B) 3 parts by weight of styrene-maleic anhydride (EF-40);
(C) 3 parts by weight of polyphenylene oxide resin (MX-90);
(D) 3 parts by weight of maleimide (BMI-2300);
(E) 30 parts by weight of OP-935 (flame retardant);
(F) 30 parts by weight of DCPD-epoxy resin;
(G) 30 parts by weight of naphthalene based epoxy resin;
(H) 60 parts by weight of fused silica (filler);
(I) 60 parts by weight of methyl ethyl ketone (MEK, solvent);
(J) 0.01 parts by weight of zinc octanoate (catalyst); and
(K) 0.35 parts by weight of 2E4MI (catalyst).

Comparative Example 8 (C8)

A resin composition comprising:
(A) 100 parts by weight of cyanate ester resin (BA-230S);
(B) 60 parts by weight of styrene-maleic anhydride (EF-40);
(C) 110 parts by weight of polyphenylene oxide resin (MX-90);
(D) 120 parts by weight of maleimide (BMI-2300);
(E) 70 parts by weight of OP-935 (flame retardant);
(F) 140 parts by weight of fused silica (filler);
(G) 220 parts by weight of methyl ethyl ketone (MEK, solvent); and
(H) 0.02 parts by weight of zinc octanoate (catalyst).

Batches of resin compositions in E1~E5 and C1~C8 are respectively mixed evenly in a blender and then are placed in an impregnator. Next pass a fiberglass cloth through the impregnator to impregnate the resin composition thereon, and then heat the resin composition into semi-cured state to obtain a prepreg.

Take four sheets of prepreg from the same batch and two sheets of 18 μm copper foil, laminate them in the sequence of copper foil, four sheets of prepregs and copper foil, and then vacuum press them under 220° C. for 2 hours to form a copper clad laminate, in which, the four prepregs are cured to form an insulating layer sandwiched between two sheets of copper foil.

Subject the aforesaid copper clad laminates and copper-free laminates after copper foil engraving to physical property testing. The tested items include glass transition temperature (Tg), heat resistance (T288), decomposition temperature of laminate (Td), solder dip test of copper-containing laminate (S/D, solder dip 288° C., 10 seconds, test the number of dip cycles to thermal delamination), solder dip test of copper-free laminate after pressure cooking test (PCT) (pressure cooking at 121° C., 3 hr, then solder dip 288° C., 20 seconds to observe the presence of delamination), peeling strength between copper foil and laminate (P/S, half ounce copper foil), dielectric constant (Dk), dissipation factor (Df), flaming test (UL94 where classification V-0 is better than V-1), and drilling properties of four-layered laminate (measure the wear of nail heads and drills).

The test results of laminates prepared using resin compositions in C1 to C5 are depicted in Table 2 and those of laminates prepared using resin compositions in C1 to C8 are depicted in Table 4. Comparing the laminates in E1-E5 that use SPB-100 as flame retardant with the laminates in C1-C8 that use OP-935 as flame retardant, it is found according to Table 2 and Table 4 that C1-C8 laminates added with OP-935 display significantly lower Td and less desirable flaming test results (V-1). Using SPB-100 as in the case of resin composition of the invention markedly increases the Td value (heat resistance) of the laminates and performs better in flaming test (V-0).

Comparing the test results of E1 and E2 shows that increasing the content of styrene-maleic anhydride (SMA) could decrease the Dk value, whereas in C2 when the SMA content exceeds 50 parts by weight, the heat resistance of the laminate (T288, Td, S/D, PCT (3 hr)) would decrease, and the poor (ex. rough) external appearance of the prepreg is less desirable, thereby resulting in lower process yield. As shown by the test results of C1, when the SMA content is less than 5 parts by weight, the Dk value of the laminate will rise to the point that fails to meet the requirement for low dielectric constant.

Comparing the test results of E1 and E3 shows that increasing the content of polyphenylene oxide (PPO) could decrease the Df value, whereas in C4 when the PPO content exceeds 100 parts by weight, the heat resistance of the laminate (T288, Td, S/D, PCT (3 hr)) suffers and the external appearance of the prepreg is poor, thereby resulting in lower process yield. But when the PPO content is less than 5 parts by weight as in the case of C3, the Df of laminate rises to the point that that fails to meet the requirement for low dissipation factor.

Comparing the test results of E1 and E4 shows that increasing the content of maleimide (BMI-2300) could increase the heat resistance (Tg) of the laminate, whereas in C6 when the BMI content exceeds 100 parts by weight, it adds to the cost of the resin composition, thereby reducing the competitiveness of the product. But when the BMI content is less than 5 parts by weight as in the case of C5, the heat resistance (Tg) of the laminate would decrease.

The test results of E1-E5 and C1-C8 show that using the components at the proportions for the resin composition as disclosed in the invention can obtain laminates with better physical properties.

TABLE 1

| Component | | E1 | E2 | E3 | E4 | E5 |
|---|---|---|---|---|---|---|
| Cyanate ester resin | BA-230S | 100 | 100 | 100 | 100 | 50 |
| | PT-30S | | | | | 50 |
| Styrene-maleic anhydride | EF-30 | | | | | 25 |
| | EF-40 | 50 | 5 | 50 | 50 | 25 |
| Polyphenylene oxide | MX-90 | 100 | 100 | 5 | 100 | 50 |
| Maleimide | BMI-2300 | 100 | 100 | 100 | 5 | 25 |
| | Homide121 | | | | | 25 |
| Flame retardant | SPB-100 | 65 | 55 | 45 | 45 | 50 |
| Epoxy resin | DCPD-epoxy | | | | | 15 |
| | Naph-epoxy | | | | | 15 |
| inorganic filler | Fused silica | 125 | 110 | 90 | 90 | 50 |
| | Spherical silica | | | | | 50 |
| Catalyst | Zinc octanoate | 0.01 | 0.01 | 0.01 | 0.01 | 0.02 |
| | 2E4MI | | | | | 0.2 |
| Solvent | MEK | 200 | 170 | 130 | 130 | 140 |

TABLE 2

| Property test | Test method | E1 | E2 | E3 | E4 | E5 |
|---|---|---|---|---|---|---|
| Tg | DSC (° C.) | 200 | 210 | 190 | 180 | 185 |
| T288 | TMA (min) | >70 | >70 | >70 | >70 | >70 |
| Td | TGA (° C.) | 394 | 395 | 393 | 392 | 392 |
| S/D | Dip cycles (288° C.) | >40 | >40 | >40 | >40 | >40 |
| PCT (3 hr) | Dip 288° C., 20 s | pass | pass | pass | pass | pass |
| P/S | Hoz Cu foil | 6.8 | 6.9 | 6.9 | 6.8 | 6.5 |
| Dk | 1 GHz | 3.70 | 3.85 | 3.73 | 3.70 | 3.75 |
| Df | 1 GHz | 0.005 | 0.005 | 0.0062 | 0.005 | 0.0065 |
| Flaming test | UL94 | V-0 | V-0 | V-0 | V-0 | V-0 |
| drilling property | | Average normal | Average normal | Average normal | Average normal | Good |
| Cost | | | | | | Low |
| Others | PP appearance | Smooth | Smooth | Smooth | Smooth | Smooth |

TABLE 3

| Component | | C1 | C2 | C3 | C4 | C5 | C6 | C7 | C8 |
|---|---|---|---|---|---|---|---|---|---|
| Cyanate ester resin | BA-230S | 100 | 100 | 100 | 100 | 100 | 100 | 100 | 100 |
| | PT-30S | | | | | | | | |
| Styrene-maleic anhydride | EF-30 | | | | | | | | |
| | EF-40 | 3 | 60 | 50 | 50 | 50 | 50 | 3 | 60 |
| Polyphenylene oxide | MX-90 | 100 | 100 | 3 | 110 | 100 | 100 | 3 | 110 |
| Maleimide | BMI-2300 | 100 | 100 | 100 | 100 | 3 | 120 | 3 | 120 |
| | Homide121 | | | | | | | | |
| Flame retardant | OP-935 | 55 | 65 | 45 | 65 | 45 | 65 | 30 | 70 |
| Epoxy resin | DCPD-epoxy | | | | | | | 30 | |
| | Naph-epoxy | | | | | | | 30 | |
| Inorganic filler | Fused silica | 110 | 130 | 90 | 130 | 90 | 130 | 60 | 140 |
| | Spherical silica | | | | | | | | |
| Catalyst | Zinc octanoate | 0.01 | 0.01 | 0.01 | 0.01 | 0.01 | 0.01 | 0.01 | 0.02 |
| | 2E4MI | | | | | | | 0.35 | |
| Solvent | MEK | 170 | 200 | 130 | 200 | 130 | 210 | 60 | 220 |

TABLE 4

| Property test | Test method | C1 | C2 | C3 | C4 | C5 | C6 | C7 | C8 |
|---|---|---|---|---|---|---|---|---|---|
| Tg | DSC (° C.) | 210 | 195 | 191 | 198 | 178 | 215 | 170 | 210 |
| T288 | TMA (min) | >70 | 35 | >70 | 65 | >70 | >70 | 20 | 30 |
| Td | TGA (° C.) | 390 | 382 | 388 | 385 | 387 | 392 | 380 | 381 |
| S/D | Dip cycles (288° C.) | >40 | 21 | >40 | >40 | >40 | >40 | 15 | 20 |
| PCT (3 hr) | Dip 288° C., 20 s | pass | fail | pass | fail | pass | pass | fail | fail |
| P/S | Hoz Cu foil | 6.9 | 6.5 | 6.9 | 6.7 | 6.8 | 6.8 | 7.2 | 6.4 |
| Dk | 1 GHz | 3.86 | 3.69 | 3.75 | 3.70 | 3.70 | 3.70 | 3.92 | 3.69 |
| Df | 1 GHz | 0.005 | 0.005 | 0.0067 | 0.005 | 0.005 | 0.005 | 0.007 | 0.005 |
| Flaming test | UL94 | V-1 | V-1 | V-1 | V-1 | V-1 | V-1 | V-1 | V-1 |
| Drilling property | | Average | Average | Average | Average | Average | Average | Average | Average |
| Cost | | normal | normal | normal | normal | normal | High | High | High |
| Others | PP appearance | Smooth | Rough | Smooth | Rough | Smooth | Smooth | Smooth | Rough |

As described above, the invention meets the three criteria of patentability, i.e. novelty, inventive step and usefulness. In terms of novelty and inventive step, the halogen-free resin composition of the invention offers the features of low dielectric constant, low dissipation factor, high heat resistance and high flame retardancy by using specific components at specific proportions, and can be made into prepreg or resin film for application in the copper clad laminate and printed circuit board. In terms of usefulness, using the products derived from the invention could fully meet the current market demands.

The preferred embodiments of the present invention have been disclosed in the examples. However the examples should not be construed as a limitation on the actual applicable scope of the invention, and as such, all modifications and alterations without departing from the spirits of the invention shall remain within the protected scope and claims of the invention.

What is claimed is:

1. A prepreg made from a halogen-free resin composition, wherein the halogen-free resin composition consists of:
    (A) 100 parts by weight of cyanate ester resin;
    (B) 5 to 50 parts by weight of styrene-maleic anhydride (SMA);
    (C) 5 to 100 parts by weight of polyphenylene oxide (PPO) resin;
    (D) 5 to 100 parts by weight of maleimide;
    (E) 10 to 150 parts by weight of phosphazene;
    (F) 10 to 1000 parts by weight of inorganic filler;
    (G) at least one catalyst; and
    (H) an optional epoxy resin.

2. The prepreg according to claim 1, wherein the cyanate ester resin comprises at least one selected from a group consisting of:

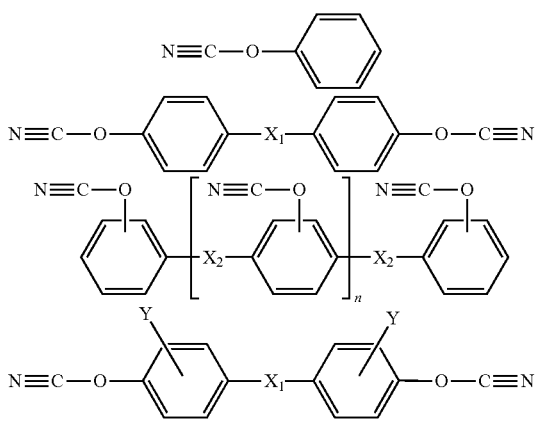

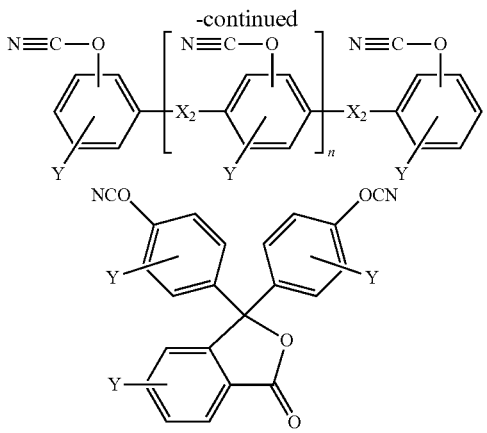

where $X_1$ and $X_2$ each independently represents at least a R, Ar, $SO_2$ or O functional group; R is selected from the group of —$C(CH_3)_2$—, —$CH(CH_3)$—, —$CH_2$— and substituted or unsubstituted dicyclopentadienyl; Ar is selected from the group of substituted or unsubstituted benzene, biphenyl, naphthalene, phenol novolac, bisphenol A, bisphenol A novolac, bisphenol F and bisphenol F novolac functional group; n is an integer greater than or equal to 1; and Y is an aliphatic functional group or an aromatic functional group.

3. The prepreg according to claim 1, wherein the polyphenylene oxide resin comprises at least one selected from a group consisting of:

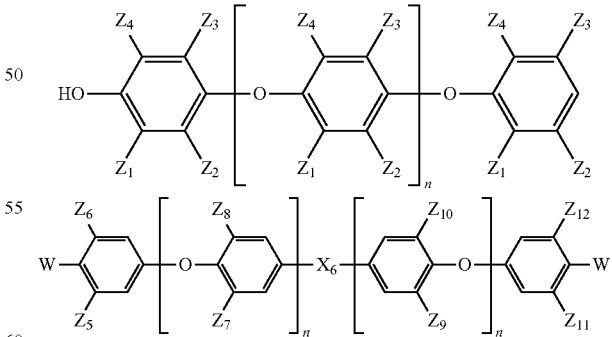

where $X_6$ is selected from the group of covalent bond, —$SO_2$—, —$C(CH_3)_2$—, —$CH(CH_3)$—, —$CH_2$—; $Z_1$ to $Z_{12}$ each independently represents hydrogen or a methyl group; W represents hydroxyl, ethylenyl, phenyl ethylenyl, propylenyl, butenyl, butadienyl or epoxy function group; and n is an integer greater than or equal to 1.

4. The prepreg according to claim 1, wherein the maleimide comprises at least one selected from a group consisting of 4,4'-diphenylmethane bismaleimide, oligomer of phenylmethane maleimide, m-phenylenebismaleimide, bisphenol A diphenyl ether bismaleimide, 3,3'-dimethyl-5,5'-diethyl-4,4'-diphenylmethane bismaleimide, 4-methyl-1,3-phenylene bismaleimide, and 1,6-bismaleimide-(2,2,4-trimethyl) hexane.

5. The prepreg according to claim 1, wherein the inorganic filler includes at least one selected from a group consisting of silica (fused, non-fused, porous, or hollow), aluminum oxide, aluminum hydroxide, magnesium oxide, magnesium hydroxide, calcium carbonate, aluminum nitride, boron nitride, aluminum silicon carbide, silicon carbide, sodium carbonate, titanium dioxide, zinc oxide, zirconium oxide, quartz, diamond powder, diamond-like powder, graphite, magnesium carbonate, potassium titanate, ceramic fiber, mica, boehmite, zinc molybdate, ammonium molybdate, zinc borate, calcium phosphate, calcined talc, talc, silicon nitride, mullite, calcined kaolin, clay, basic magnesium sulfate whisker, mullite whisker, barium sulfate, magnesium hydroxide whisker, magnesium oxide whisker, calcium oxide whisker, nano carbon tube, nano silica and inorganic powder thereof, and powder particles modified by organic core-shell as insulator.

6. A copper clad laminate made from the prepreg according to claim 1 and at least one copper foil.

7. A printed circuit board comprising the copper clad laminate according to claim 6.

\* \* \* \* \*